United States Patent [19]
Lemelson

[11] Patent Number: 5,823,993
[45] Date of Patent: *Oct. 20, 1998

[54] COMPUTER CONTROLLED DRUG INJECTION SYSTEM AND METHOD

[76] Inventor: Jerome H. Lemelson, Suite 286, Unit 802, 930 Tahoe Blvd., Incline Village, Nev. 89451-9436

[ * ] Notice: The term of this patent shall not extend beyond the expiration date of Pat. No. 5,571,083.

[21] Appl. No.: 563,850

[22] Filed: Nov. 27, 1995

Related U.S. Application Data

[63] Continuation of Ser. No. 199,720, Feb. 18, 1994, abandoned.

[51] Int. Cl.$^6$ .................................................. A61M 31/00
[52] U.S. Cl. ................................ 604/51; 604/50; 604/67; 604/21; 604/22; 128/898; 128/DIG. 13
[58] Field of Search ........................... 604/65–67, 49–53, 604/207–209, 19–22; 128/897, 898, DIG. 13, DIG. 1; 606/15

[56] References Cited

U.S. PATENT DOCUMENTS

| | | | |
|---|---|---|---|
| 4,566,438 | 1/1986 | Liese et al. ............................ | 606/15 X |
| 5,042,494 | 8/1991 | Alfano ................................... | 128/665 |
| 5,104,392 | 4/1992 | Kittrell et al. ........................... | 606/15 |
| 5,445,166 | 8/1995 | Taylor ..................................... | 128/897 |
| 5,564,437 | 10/1996 | Bainville et al. ....................... | 128/897 |
| 5,571,083 | 11/1996 | Lemelson ............................... | 604/51 |

FOREIGN PATENT DOCUMENTS

| | | |
|---|---|---|
| 62-182653 | 8/1987 | Japan . |
| 3162825 | 7/1991 | Japan . |
| 4156828 | 5/1992 | Japan . |

OTHER PUBLICATIONS

Cothren, R.M. et al., Gastrointestinal tissue diagnosis by laser–induced fluorescence spectroscopy & endoscopy, Gastrointestinal Endoscopy 36:2, 1990, pp. 105–111.

Kapadia et al, *Laser–induced Fluorescence Spectroscopy of Human Colonic mucosia, Detection of Adenomatous Transformation,* Gastroenterology 1990:99, pp. 150–157.

Schomacker et al, *Ultraviolet Laser–Induced Fluorescence of Colonic Tissue: Basic Biology and Diagnostic Potential,* Lasers in Surgery and Medicine 12:68–78 (1992).

Perk et al, *Laser Induced Fluorescence Identification of Sinoatrial and Antrioventricular Nodal Conduction Tissue,* Pace vol. 16, Aug. 1993, pp. 1701–1712.

Hirano et al, *Photodynamic Cancer Diagnosis and Treatment System Consisting of Pulse Lasers and an Endoscopic Spectro–Image Analyzer,* Lasers in the Life Sciences, 3(2), 1989 pp. 99–116.

Kwoh et al., "A Robot with Improved Absolute Positioning Accuracy for CT Guided Stereotactic Surgery," 35 *IEEE Transactions on Biomedical Engineering* Feb. 1988.

Goerss et al., "Automated Stereotactic Positioning System," *Appl. Neurophysiol.* 50: 100–106 (1987).

*Primary Examiner*—Michael Powell Buiz
*Assistant Examiner*—Ronald K. Stright, Jr.

[57] ABSTRACT

A system and method are disclosed for internally administering a medicinal agent to a patient under the automatic control of a computer. A diagnostic imaging modality, such as a CAT or MRI scanning system, generates one or more images of the patient's anatomy showing a diseased area such as a tumor to which it is desired to deliver the medicinal agent by injection. For each such image, location coordinates with respect to a patient support structure are calculated by the computer for each individual pixel making up the image. Location coordinates are then defined for a select body region corresponding to pixels of the anatomical image(s) designated by a user of the system to receive the medicinal agent. The computer then operates a manipulator arm in order to position an injection needle mounted on the arm adjacent to the select body region and insert the needle into the region at the appropriate depth. An injector is then operated under computer control to force a predetermined amount of the medicinal agent out of a conduit within the injection needle and into the select body region.

20 Claims, 2 Drawing Sheets

COMPUTER CONTROLLED DRUG INJECTION SYSTEM AND METHOD

This is a continuation of application Ser. No. 08/199,720, filed Feb. 18, 1994, now abandoned.

BACKGROUND AND SUMMARY OF THE INVENTION

In treating disease such as cancer, it is sometimes desirable to deliver drugs or other agents directly to the tumor rather than rely on systemic dissemination of the drug by the bloodstream. Such local application can both maximize the concentration of the drug at its site of action and prolong the duration of its therapeutic effect as well as lessen side effects. For example, in photodynamic therapy, hematoporphyrin derivatives, which are rendered tumoricidal when stimulated by light, are deposited into a tumor. The tumor is then irradiated with a laser beam. Even if the laser beam is precisely directed, tissue surrounding the malignancy may be destroyed due its having taken up hematoporphyrin and being exposed to the laser radiation. It would be advantageous in this and other kinds of injection therapy to deliver the agent as precisely as possible to the tumor or other diseased site.

In accordance with the present invention, a hypodermic injection needle is manipulated by a manipulator under computer control so as to deliver a predetermined amount of a drug or other agent to a select anatomical area of a patient's body as defined by location coordinates locating the area with respect to a structure supporting the patient. In one embodiment of the invention, the needle is mechanically positioned by a robotic arm operating automatically in accordance with imaging information fed to the computer. In other embodiments, the needle is positioned manually by an operator while a computer monitors the operation, involving a computer generated indication of when the tip of the needle is operatively positioned so as to effect the injection of the drug at a selected coordinate location.

Also in accordance with the invention, the injection needle may contain, in addition to a conduit for delivering the drug or other agent, optical waveguides for transmitting and receiving light. (The term "light" as used herein refers to electromagnetic radiation of any selected wavelength and is not restricted to the visible spectrum.) One of the optical waveguides, which may consist of an optical fiber or fibers disposed within a conduit of the needle or may be constructed integral with the needle, is used to transmit electromagnetic radiation, generated by a laser or otherwise, to a selected anatomical site. Such transmitted radiation may be used therapeutically, such as in photodynamic therapy or in performing a surgical operation with a laser beam, and/or may be used for diagnostic purposes. In the latter case, light emitted from the needle is reflected or scattered by physical features of the tissure in which the needle is inserted or causes fluorescent radiation to be generated. The reflected or scattered radiation is received by a second optical waveguide within the injection needle and transmitted to a photodetector for detecting its phase and intensity. The output of the photodetector is then fed to a computer for spectroscopic analysis which may be used to derive information about the tissue structures or to generate an image. In alternative embodiments, the light receiving waveguide is contained within a separate needle which is disposed at another site so as to capture scattered radiation. In still another embodiment, the photodetector is located externally and receives scattered radiation as it exits the tissue and emerges from the patient's body.

It is therefore an object of the present invention to provide a system for precisely delivering drugs or other agents to selected anatomical locations.

It is a further object to provide a system which enables user designation of selected anatomical locations for drug delivery via images generated by imaging devices which are stored in a computer and displayed to the user.

It is a further object to provide a system which automatically injects a drug to user selected locations under computer control.

It is a further object to provide a system for delivering therapeutic radiation to select anatomical locations under control of a computer.

It is a further object to provide a system for delivering diagnostic radiation to select anatomical locations under control of a computer, detecting the radiation scattered by physical features of the tissue, and processing the detected radiation so as to derive information about structures within the tissue.

Other objects, features, and advantages of the invention will become evident in light of the following detailed description considered in conjunction with the referenced drawings of a preferred exemplary embodiment according to the present invention.

DETAILED DESCRIPTION OF THE INVENTION

A. General

Figure 1:
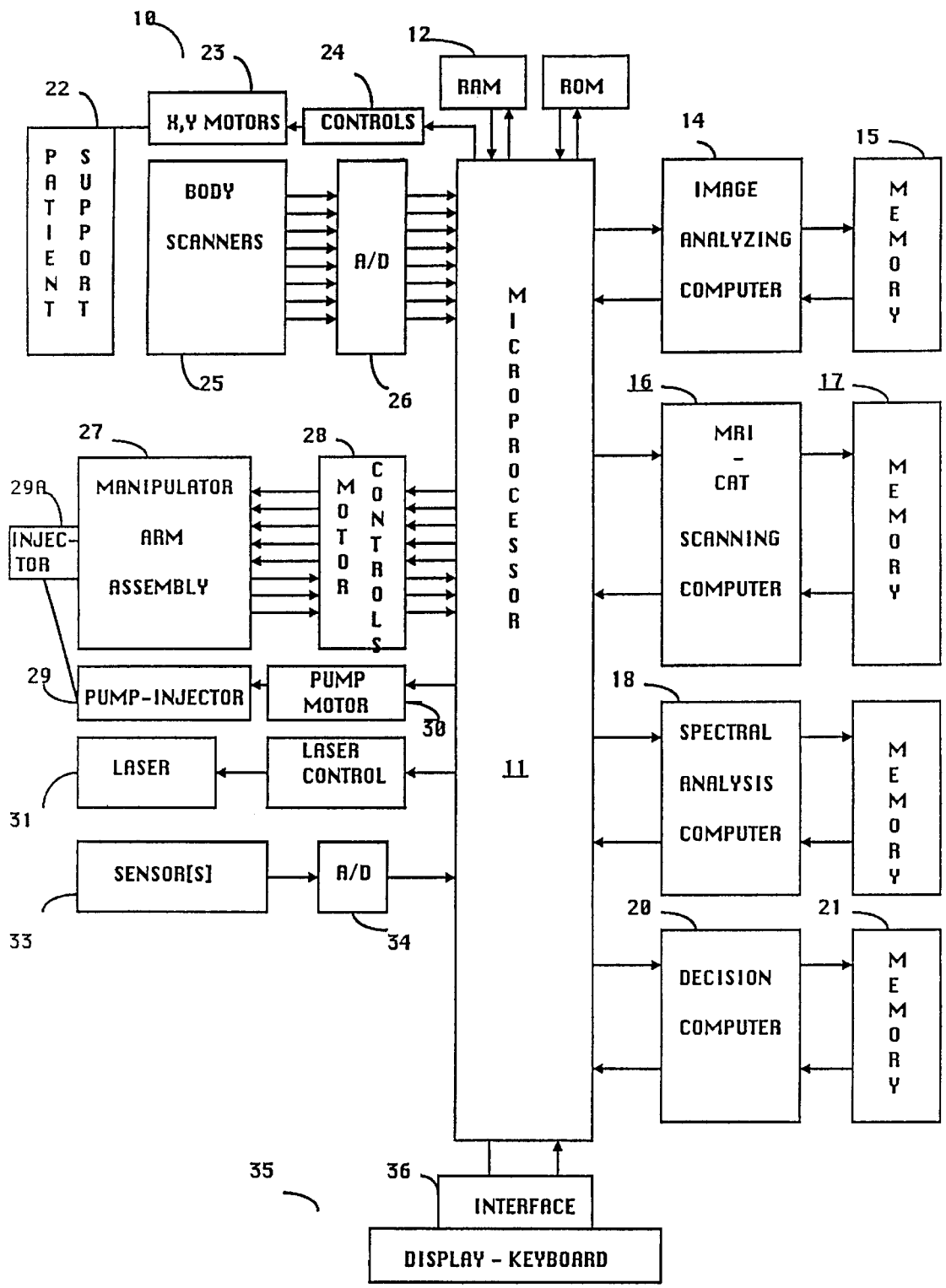
FIG. 1 is a block diagram of an exemplary system for delivering drugs and other therapeutic agents in accordance with the present invention.

The location coordinates of tissue of a living being into which a drug is to be injected are defined with respect to images of the patient's anatomy showing a lesion or anatomical structure, which may be generated, for example, by employing computerized axial tomography (CAT scanning), magnetic resonance imaging (MRI), or ultrasonography. In accordance with the present invention, a computer image of a select anatomical area is generated by using one of the conventional imaging modalities mentioned above, and a location coordinate with respect to a patient support structure is assigned to each pixel making up the image. The tumor is then located on the image or images by a radiologist, for example, with selected of the pixels making up the image of the tumor selected as the location to which it is desired to inject a drug or other agent. A preferred means by which this can be performed is to display the images on a display monitor having a manually positionable cursor for outlining an area containing the lesion. The operator of the system then inputs to a computer digital data defining the anatomical location to which the drug is to be delivered as represented by the select pixels within the outlined area. As described below, each pixel of each image displayed by the computer has assigned to it a set of location coordinates with respect to a structure such as a table supporting the patient while the imaging is performed. The same or a similar patient support structure is then utilized during the drug injection procedure, and the injection needle is directed in movement under computer control so as to deliver the drug to select location coordinates with respect to that support structure.

The patient is required to be in the same position with respect to the support structure during both the imaging and therapeutic radiation procedures so that the location coordinates selected will correspond to the proper anatomical region. One way of accomplishing this is to use a patient support structure having a moldable support surface which can be made to conform to the shape of the patient's body as a kind of body cast. Once a body impression is made, the patient may be placed in the same position on the support structure for both imaging and subsequent drug injection procedures. Such a moldable patient support also serves to immobilize the patient during both procedures. Other patient retraint devices, such as straps, may also be employed.

The way in which location coordinates are assigned to each image pixel depends upon the particular imaging modality. For example, with a conventional CAT scanner, the x-ray tube emits a narrow beam of x-rays toward the patient with an x-ray detector, such as an array of scintillation detectors, positioned on the opposite side of the patient on which an x-ray shadow is formed. The x-ray tube and detectors, mounted on a rigid gantry, are rotated in multiple steps about the body until an entire axial slice is viewed from multiple angles. Codes defining the data acquired by the scintillation detectors are entered into a computer which uses mathematical algorithms to reconstruct a cross-sectional image of the region examined. The computerized scanner calculates the degree to which the tissue interposed between the x-ray tube and the detectors absorb the x-ray beam and thereby provides an attenuation coefficient for each area of tissue examined. Essentially, the quantity of x-ray absorbed in small volumes (voxels) of body tissue in the slice is computed. Computer analysis of the data collected then allows assignment of a numerical value to each small area (pixel) of the cross-sectional plane. By means of a digital-to-analog converter, the numerical value of each pixel is translated to a gray scale for driving a CRT display.

Due to the nature of the CAT scanning image reconstruction algorithm, the computer necessarily must assign location coordinates to each pixel with respect to the x-ray detector in order to generate the displayed image. Such coordinates are computed with respect to the patient support structure in the axial plane which is being imaged. In order for such coordinates to be useable for directing a hypodermic needle in accordance with the present invention, however, they must be scaled and combined with another coordinate along the axial axis. In order to assign an axial location coordinate with respect to the patient support structure for each pixel, the positions of the x-ray tube and detector with repect to the patient support surface are sensed, and digital signals are generated which are input to the computer during the imaging procedure. The location coordinates for each pixel making up the image with respect to the patient support structure may be then readily calculated.

In pulse-echo ultrasound techniques, an ultrasonic pulse is transmitted through the body tissues with the reflected echoes from each acoustical interface sensed by a transducer in order to provide a train of digital signals which define an image of the underlying structure. In so-called B-mode ultrasound, the pulse-echo procedure is performed in scanning fashion to image the underlying morphologic structures in a tomographic format. The resulting scanning signals, after digitization, can then be used by the computer to construct a two-dimensional array of pixel values for driving a display. Each pixel, in order to construct an image, is thus assigned a coordinate location with respect to the transducer in the same plane at which the ultrasound is emitted. Conventional ultrasonic scanning, however, requires that the ultrasonic transducer be contacted to the body surface over the region to be examined and positioned so as to scan at various angles. In order for the computer to compute the location coordinates for each pixel making up a display of an ultrasonic scan, the transducer is mounted on a movable arm having sensors in its joints for producing signals proportional to the degree of flexion of each such joint, which signals are then fed to the computer for calculation of the arm's position and orientation. Using appropriate scaling factors, the location coordinates for each pixel making up the image with respect to the patient support means may be readily calculated by a computer supplied with the above-mentioned data.

Computerized image construction in conventional MRI scanners, for employment in the present invention, is similar to that used in CAT scanners in that intensity values for an array of pixel values are computed with each pixel value stored in the computer assigned a set of location coordinates in order to generate the image. In MRI scanning, nuclei such as protons are subjected to a magnetic field gradient, called the slice-select gradient, which varies along the axis perpendicular to the plane of the image. Certain protons within the magnetic field gradient are excited to resonance by a so-called 90 degree RF pulse which causes them to emit detectable radiation. The amplitude and frequency of such emitted radiation is used to assign proton density values to pixels and generate the MRI image. The location coordinates of each pixel in the image are with respect to the patient support structure within the plane of the image cross-section, assuming the receiver coil of the MRI scanner remains at a fixed distance from the patient support structure. In order to derive an axial coordinate value (ie., along an axis perpendicular to the plane of the cross-sectional image) for each pixel, it is necessary for the computer to compute the distance along the slice-select gradient with respect to the patient support structure where the Larmor frequency of the excited nuclei corresponds to the frequency of the 90 degree RF pulse. Such a computation only requires that the computer be supplied with data reflecting the magnitude of the slice-select gradient field versus distance and the frequency of the RF pulse which can either be assumed to be in accordance with computer command or can be sensed by magnetometers and a separate RF receiver coil. MRI scanners also allow the particular gradient fields to be generated along arbitrarily chosen axes so as to produce images not only in the transverse plane but also in coronal, sagittal, and oblique planes. The axial coordinate for each image is then computed in the same way as just described, but the coordinate is then along an axis perpendicular to the plane of the cross-sectional image. Finally, since the patient support structure and the MRI imaging apparatus are relatively moveable with respect to one another, the computer is fed with data produced by position sensing means so that the location coordinates can be translated so as to be with respect to the patient support structure.

Once the location coordinates defining the select body region into which it is desired to inject a medicinal agent have been calculated by the computer, a manipulator arm on which is mounted an injection assembly is moved to the select body region under computer control. The injection needle is then inserted into the select body region at an insertion site on the surface of the body, and a predetermined amount of the medicinal agent is injected into the region.

The process may then be repeated at different needle insertion depths for the same insertion site or at different insertion sites corresponding to the select body region. As will be described more fully below, electro-optical sensing means may be provided allowing the effects of the injection to be monitored by the computer so that the results of the monitoring may be used to control further injections.

B. System Description

In FIG. 1 is shown a system 10 for automatically detecting and treating cancerous and precancerous growths, such as tumors in a living being. Treatment may comprise the destruction of such detected growths or rendering same non-cancerous by applying a select amount of a biological and/or a chemical agent to such tumors or select amounts of a plurality of such agents, either as a single or a plurality of doses thereof. The cancer regulating or cancer cell destroying agent(s) may be applied by injection wherein a hollow tube or needle, such as a hypodermic needle, is automatically positioned with respect to the body of the living being by means of a multiple axis electromechanical manipulator which is controlled in its operation by coded control signals generated as a result of automatically scanning that portion of the body of the living being containing a tumor or group of tumors which tumors are detectable and quantized in size, shapes and locations within the body by computer analysis of the scanning signals.

The scanning signals may be generated by one or more known scanning devices such as a nuclear magnetic resonance (NMR or MRI) scanning system, a computerized axial tomography (CAT) scanning system employing X-ray scanning, a positron emission tomographic (PET) scanning system, various infrared scanning systems operable to generate image signals of hidden tissue and bones, ultrasonic pulse-echo scanning systems or the like. Such scanning signals may be computer processed and analyzed to generate multiple cross-sectional views of the portion of the body containing the tumor or tumors for locating and quantizing the extent of the tumor(s). The image information defined in the cross-sectional views or slices of the body tissue containing the tumor, may be digitized to generate trains of digital (picture) signals which are analyzed by a computer wherein resulting code signals are generated defining the borders of the tumor(s) and which may be further computer processed to provide further code signals indicative of coordinate locations of the surface(s) of the tumor(s) and the extent or volume of the tumor(s). Such coded information may be used by the computer to control the operation of an automatic multi-axis manipulator for a surgical or treatment device, such as a hypodermic needle and a motorized pump, to automatically position and cause the needle to either directly penetrate a skin or surface tumor or to pass through normal tissue aligned with a subsurface tumor and controllably penetrate such tumor. After and/or during such penetration of tumor tissue, the computer controls the operation of a pump motor and/or valve actuator solenoid to cause a select amount of a tumor killing or regulating drug to enter the tissue of the tumor and to operate thereafter to arrest the growth of the tumor, shrink or destroy same over a period of time.

The medical procedure described above may be applied once or repeated a number of times to destroy a tumor or group of tumors without surgery or may supplement surgery which may also be computer controlled by one or more surgical devices such as powered cutting tools, blades positioned and moved in cutting operations by the computer controlled manipulator, nozzles generating high velocity jets of liquid medication(s), one or more lasers generating a beam or beams of tissue penetrating surgical radiation or other surgical device(s) supported and operatively moved by the manipulator.

System 10 comprises a number of computers, devices and subsystems which are automatically controlled in their operation or generate feedback information in the form of signals passed through a control computer or microprocessor 11. An image analyzing computer 14 with an attendant programmable memory 15 analyzes image information generated by an NMR or CAT scanning computer 16 with attendant memory 17 which receives digitized image information from a plurality of MRI scanners 25 which scan a select portion of the body of a patient held immovable against a patient support or table 22 which is motorized and driven in multi-axis movement by a plurality of gear motors 23, the controls 24 of which are operated by trains of digital control signals passed through microprocessor 11 from either manual controls and/or one of the computers connected to the microprocessor. While conventional CAT and MRI scanning arrangements generally rotate and axially move the patient through the scanning field the MRI, CAT, PET, etc. body scanners or array of sensors 25 may also be supported on a mount which is motor driven and controlled to move about or along one or more axes by means of a computer such as a decision computer connected to the microprocessor and operable to analyze the signals output by one or more of the computers 14 and 16 to effect control of the treatment operation and/or at least a portion of the scanning operation. The analog image signals output by the body scanners are converted to trains of digital image signals by one or more analog-to-digital converters 26 which pass such trains of signals through microprocessor 11 to the MRI or CAT scanning computer 16 for analysis and conversion to usable image information for use by the image analyzing computer 14.

In the preferred embodiment, a manipulator arm assembly 27 of conventional design is supported adjacent the patient support 22 to which it is preferably connected. The plurality of arms of the multi-axis manipulator are operated by respective reversible gear motors (not shown) which are controlled in their operations by a bank of controls 28 which receive and pass direct command control signals from the microprocessor 20 and apply feedback signals from the manipulator motors to effect a suitable degree of precision operation of the manipulator to selectively position its operating head and surgical device or injection needle in alignment with the select tissue containing or extending over the below-surface tumor to be treated or operated on.

In FIG. 1, the manipulator 27 has an operating head 29A containing an elongated injector tube or hypodermic-type needle supported thereby and operable to be driven by controlled operation of one or more of the motors driving the manipulator 27 or a separate motor supported by the operating head to force the injection needle through body tissue and cause it to penetrate one or more tumors detected and located by the scanning system.

A pump motor 30 drives a pump 29 when its control input is operated by a start-signal received from computer 20 after the manipulator 27 has been controlled to position the injection needle in alignment with the detected tumor and the needle has penetrated tissue and entered the tumor.

Also shown in FIG. 1 is a laser 31 which may be supported by the manipulator and is operable under the control of computer 20 to pass laser radiation to a light pipe extending through the injection tube or needle when it has penetrated tissue of the tumor to irradiate and cause tissue cells of the tumor to fluoresce and generate spectrally analyzable radiation which may be photoelectrically detected by a detector or detector array 33 supported at the end of the injection needle or operable to receive such radiation from an additional light pipe extending through and along the needle to an end opening therein. The resulting detection signals are passed to an analog-to-digital converter 34 and the digital signals generated are passed through the microprocessor 11 to a spectral analysis computer 18 which spectrally analyzes same to determine if the laser radiation excited tissue is malignant. Codes generated as the result of such automatic spectral analysis are passed from computer 18 to the decision computer 20 to determine the amount and type of or biological and/or chemical drug necessary to treat or destroy the tumor. In other words, the code signals output by the spectral analysis computer 18 which indicate if the cells of the tumor are cancerous and may also be indicative of the type of cancer present in the tissue scanned, are applied to the decision computer 20 which queries its memory 21 to determine which of a plurality of chemical and/or biological agents available in different storage reservoirs should be injected through the injector 29A supported at the end of the manipulator arm assembly 27 into and/or adjacent the tumor or cancerous tissue scanned and analyzed. Quantitative code signals generated by either or both computers 14 and 16 are employed by the decision computer 20 to compute the quantity of the select drug or drugs passed to the injector 29A when the end of the injection tube or hollow needle thereof is predeterminately disposed with respect to the tumor or cancerous tissue, are passed to the decision computer and employed to determine and control the flow of one or more select quantities of one or more tumor killing or regulating drugs to the cancerous growth once the injector is properly located relative thereto.

The sensor or sensor array 33 may be located on the manipulator head or injector assembly 29A and may be operable to receive either or both light reflected from cancerous tissue adjacent the end of the injection needle and fluorescence radiation generated when the tissue intersected by the laser light is caused to fluoresce. An optical fiber light pipe may extend from the output of the laser 31 to the open end of the injection tube or needle to conduct laser light to tissue adjacent the open end of the needle while a second optical fiber may extend from such open end back up the light pipe to the sensor 33. The diameters of the two fibers or fiber bundles may be such as to permit a liquid drug to pass down along the needle or tube and into select tissue penetrated by the needle. Resulting spectral radiation emitted by the tissue intersected by the laser radiation is passed to the end of the optical fiber adapted to receive same and back along such fiber to the photodetector at the other end thereof which generates an analog electrical signal modulated with spectral information relating to the tissue caused to fluoresce by the laser radiation. If the laser is a tunable laser and is operable to varying in wave length or frequency over a given range, additional information on the composition of the fluorescing tissue may be derived for analysis by the spectral analysis computer 18 to effect automatic diagnosis and treatment as described under the control of the decision computer 20 which receives the coded information output by the spectral computer 18.

Also shown connected to the control computer or microprocessor 11 via an interface 36 is a stand-alone computer 35 such as a workstation or PC which includes a display and a keyboard which is operable to input data to the RAM 12 or any of the computers 14,16 and 18 or to control the operation of the manipulator 27, pump motor 30 and laser 31 or a plurality of such subsystems and devices for performing the described treatment or surgical operations. It is noted that the pump 29 may be varied in its operation in accordance with the control signals applied from the decision computer 20 to an integral or external controller for such motor to predetermine the quantity and rate of flow of liquid medication or drug pumped to the injector 29A after its injection tube or tubular needle has been driven under computer control to a select location with respect to select tissue such as tumor tissue. A plurality of pumps, such as pump 29 operated by respective pump motors may be provided mounted on the operating head of the manipulator, each of which is operable to force flow a different medical material from a respective of a number of reservoirs to the needle or tube of the injector 29A for use in destroying the tumor, stimulating the body's immune system to effect cancer tissue destruction or in arresting the growth of the cancer or tumor.

System 10 may also be operable to automatically perform auxiliary or other operations on select tumors and cancerous tissue such as cutting operations on select tissue using one or more automatically positioned and controlled cutting tools which are supported by the operating head of the manipulator 27 and controlled in powered operation to cut select tissue or employing one or more lasers to ablate, burn or otherwise operate on such select tissue. Such surgical operation may be effected per se or in combination with the described selective injection of liquid medical material(s) to destroy select tumors and cancerous tissue in accordance with location information derived from one or more of the described scanning techniques.

A modified form of system 10 may also be a computer controlled manipulator operable to (a) insert and drive a catheter into and through a body duct, (b) effect a small opening in a select portion of skin or other body tissue and insert a surgical instrument such as a laparoscope therethrough and power drive same in one or more of a plurality of operations on and with respect to select tissue within the body, which operations may include forcing an injection needle from the tube of the instrument to cause it to penetrate and inject a select amount of liquid medical material as described into select tissue for treatment and/or diagnostic purposes. Such operations may also include the application of laser light energy, as described, to inspect and/or operate on select tissue deep in the body.

System 10 may also be utilized to perform automatic operations on skin or surface conditions such as skin cancers and polyps, ulcers and the like formed in the wall of the intestinal track or other organ accessible to direct electrooptical scanning with light such as laser light and photoelectric detectors of reflected and/or fluorescent light emitted by the tissue scanned. For such operations, the penetrating energy (CAT, MRI, PET, etc.) body scanning system 25 may be supplemented or replaced by a photoelectric scanning system employing one or more lasers and a photodetector or array of sensors of reflected and/or fluorescent radiation generated by tissue scanned and or by a television camera or an infrared camera or sensor array. Such sensing arrangement may be fixed with respect to the patient support 22 and operated to scan a select portion of the body of a patient defined, for example, by a scanning field of the television camera or sensor array. The support 22 may also be motor driven during and/or between scannings along two or more axes under the control of signals generated by the RAM 12 or the decision computer 20 depending in the location and extent of the condition being treated.

The above described photoelectric scanning arrangements may also be supported by an automatic manipulator which may comprise the manipulator 27 or be separate therefrom and operable in response to computer generated control signals to automatically effect the electro-optical scanning of select body tissue, such as skin tissue, per se or in combination with the described body scanning system 25 to generate image information as to the location, extent and nature of the disease tissue or growth(s) requiring treatment of one or more of the types described. Such treatment may comprise one or more of the operations of controllably injecting one or more select quantities of liquid biological and/or chemical agents in one or more sequential or time separated doses into select portions of tissue while the injection instrument or needle is at a select location and/or while in controlled movement through select tissue as determined by the described computer analysis of the scanning signals, and/or the controlled operation of one or more surgical devices such as knives, rotary cutting tools, lasers generating operating light energy. The latter surgical tools may be supported by the operating head of manipulator 27 or an auxiliary manipulator, the controls of which are connected to computer 11.

Not shown, but assumed to form part of the personal computer 35 and its peripheral controllers, are manual means for effecting selective control of the described manipulator(s) and the body and tissue scanning devices, for use by medical personnel in supplementing the computer controlled operations in the performance of certain operations to detect and treat select tissue of the body.

System 10 may also be employed to automatically determine the depth and three dimensional shape of the tumor, lesion or growth and to provide coded control signals for effecting automatic surgery or treatment as described. Thus the body scanning system 25 may be employed per se to generate computer analyzable image information or may be supplemented with image information generated by an electronic camera such as a television camera and/or by one or more laser-photodetector scanning arrangements which are fixedly supported adjacent the patient support, supported to move with the manipulator of the scanners of system 25 and/or supported on the head of the automatic manipulator 27 or by a separate manipulator (not shown).

C. Injector and Needle Description

Figure 2:
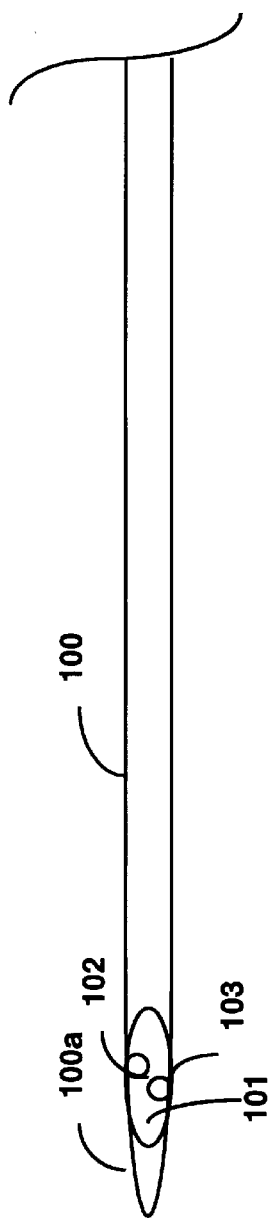
FIG. 2 shows an injection assembly for use in delivering precise amounts of a drug or other agent through an injection needle.

FIG. 2 depicts the tip of an injection needle 100 in accordance with the present invention. A sharp tip 100a allows the needle to puncture skin and other tissue and insert into a select body region. Disposed within the needle is a conduit 101 for delivering a drug or other agent to the tissue in which the needle is inserted. Also disposed within the needle is an optical waveguide 102 for transmitting light to the tissue for therapeutic or diagnostic purposes. Such waveguide may consist of an optical fiber supported within a passageway or may be a waveguide consructed integral with the needle. In the latter case, a light transmissive core of one refractive index is surrounded along the length of the needle by material of another refractive index so as to constitute a cladding and enable the transmission of electromagnetic radiation. Such radiation may be laser radiation generated by laser 31 used to excite hematoporphyrin derivatives in photodynamic therapy or used to perform a surgical procedure, or may be other types of therapeutic radiation. If the light radiated from waveguide 102 is to be used for diagnostic purposes, a second waveguide 103 also disposed within the needle 100 captures the radiation emitted from waveguide 101 after it has been scattered or reflected by tissue components such as cells, subcellular organelles, molecules, or other structures. Such light is transmitted by waveguide 102 to photodetector 33 and analyzed by spectral analysis computer 18.

Figure 3:
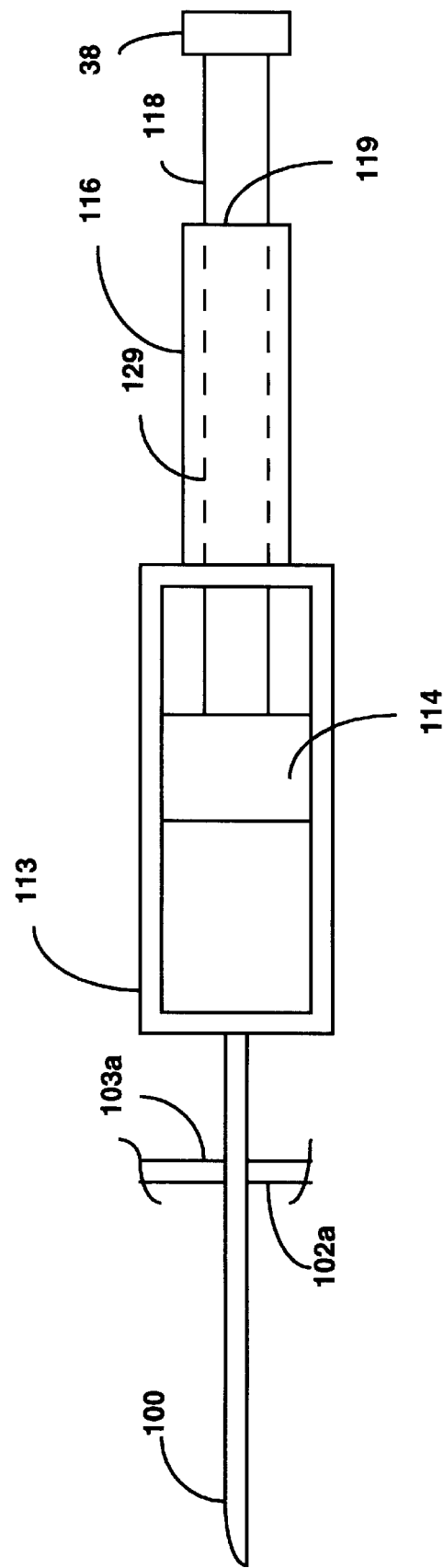
FIG. 3 shows the tip an injection needle having a conduit for drug delivery and optical waveguides for transmitting and receiving light.

FIG. 3 shows an exemplary injector 29 for delivering a controlled amount of a drug or other agent to the tissue through conduit 101. The injector 29 comprises a syringe 113 for containing a quantity of the drug to be injected and connected to needle 100. A plunger or piston 114 moves through the barrel of the syringe 113 to displace the fluent drug into conduit 101 from where the drug is injected into the selected tissue site. Also shown connected to needle 100 are an optical fiber cable 103a for transmitting light from laser 31 to waveguide 103 and an optical fiber cable 102a for transmitting light from waveguide 102 to sensor 33. The injector 29 is mounted on manipulator arm 27 so as to be movable and positionable under computer control.

In order to for the injector to deliver controlled amounts of a drug under the control of microprocessor 11, the linear motion of plunger 114 is actuated by a motor 38 which rotates a shaft 118 joined to plunger 114. Shaft 118 is threaded and disposed within an oppositely threaded member 119 attached to the end of syringe 113 such that rotary motion of the shaft 114 causes linear motion of the plunger 114 through the barrel of syringe 113. The position of the plunger 114 is fed back to the microprocessor 11 by means of a linear differential transformer 116 mounted to syringe 113 and having an axial passage through which shaft 118 moves. A magnetic core 119 is formed within the portion of shaft 118 which moves axially through the transformer 116 such that a voltage signal proportional to the axial position of the core is thereby generated. Since the axial position of the core 119 corresponds to the axial position of the plunger 114 within syringe 113, the motion of the plunger 114 may be precisely controlled by microprocessor 11 to deliver controlled amounts of the drug to the needle 100.

D. Example Applications

1. The invention as described above may be put to any number of uses in delivering controlled amounts of drugs or other agents to select internal anatomical sites capable of being imaged, such as a tumor or infected area. Such agents may include chemotherapeutic drugs, cryogenic fluids, or biological agents such as viruses or bacteria, or polynucleotides (ie., strands of DNA or RNA). Any of these agents may be packaged into lipsomes for facilitating their intracellular delivery. For example, DNA sequences comprising genes maybe packaged into liposomes which are then injected into a tumor in the manner described above. After the liposomes are taken up by tumor cells, the genes recombine with cellular chromosomes to exert a therapeutic effect either by killing the cell, slowing its growth rate, inhibiting metastasis, or rendering the cell non-cancerous. In one specific application, such liposomes may contain nucleic acid sequences corresponding to a histocompatibility antigen such as HLA-B7. When the HLA-B7 gene is expressed, the corresponding antigen appears on the surface of the cell where it is recognized by the patient's immune system which causes cytotoxic T-cells to attack the tumor. The present invention allows the location and amount of the injection of liposomes to be controlled as precisely as possible. Such precise control minimizes occurrences of normal cells taking up and expressing the HLA-B7 gene which causes them to be targeted by the immune system. Such uptake of the liposomes by normal cells may be further minimized through the use of targeted liposomes where a monoclonal antibody with a specific binding affinity for a tumor specific antigen is conjugated to the liposome.

2. The present invention is particularly suitable for use in photodynamic therapy where the injection needle as described above may be used to inject the hematoporphyrin derivatives into the tumor, irradiate the tumor with laser light to toxify the hematoporphyrin derivatives, and monitor the effects of the therapy by spectroscopic analysis of scattered radiation. The present invention thus allows precise control of the location and amount of the hematoporphyrin injection as well as control of the area irradiated by the laser beam, both of which lessen adverse side effects of the therapy.

3. Another aspect of the invention involves combining a self-setting adhesive with the injected agent or the use of a needle 100 having a second conduit for flowing a second agent into the tissue. Such second agent may be a second chemotherapeutic or biological agent or an auxiliary substance. One such auxiliary substance is a biodegradeable or other liquid adhesive which operates to prevent the tumor cells from separating from the tumor due to the mechanical disruption by the needle and implanting along the needle track as sometimes occurs during needle biopsies.

4. Other types of therapeutic radiation may also be delivered via the waveguide 101 of needle 100. Also, in accordance with another embodiment of the present invention, therapeutic radiation from an external source (including modalities such as x-rays, gamma rays from cobalt 60 and cesium 137, and beams of high-energy electrons, protons, heavy ions, and neutrons) instead of a needle may be directed under computer control so as to deliver a select amount of radiation of predetermined energy to a select anatomical area as defined by location coordinates locating the area with respect to a structure supporting the patient where the location coordinates are generated as described above. The methods by which the radiation is variably directed depend upon the type of radiation employed and may include, for example, mechanical positioning of the radiation source where a signal indicative of the position is generated and fed back to the computer, use of focusing and steering magnets in the case of particle beams, and mechanical positioning by means of a manipulator of radiation attenuators (ie., so-called wedge filters) so as to direct multiple radiation beams to deliver a maximum amount of energy to the desired location. In other embodiments of the invention, the radiation souce may be positioned manually, wherein a computer generates an indication of when the radiation source is positioned so as to direct the radiation at the selected coordinate location.

5. An injection needle may also be constructed in accordance with the present invention which only incorporates certain features of the injection needle 100 described above. For example, such an injection needle may not contain a conduit for flowing a medicinal agent but only one or more waveguides for transmitting and/or receiving electromagnetic radiation. One use of the needle waveguides is an application where electromagnetic energy (eg., light or microwaves) is transmitted through a waveguide within the needle which then acts so as to heat the tip of the needle or another structure, the latter then being used to perform a surgical operation. Another use of an injection needle waveguide is to transmit light internally to a body region and detect the photons emerging therefrom so as to form an image of the body region based of the effects of scattering by structures within the body region.

6. In another form of the invention, the injection needle itself may define a light pipe made of stainless steel, structural glass or other material, through which one or more fluent medical materials may be controllably flowed to cure or treat disease, such as cancer or other malady by directly injecting same into select tissue, such as a tumor, wherein both the movement of the needle and the flowing of one or more fluids therethrough are computer controlled as described herein. Such a light-pipe defining injection needle may be open at or near the end thereof to permit both a select fluent medical material or materials to be flowed therefrom and radiation, such as laser light passed through the needle to pass through such opening to perform one or more of the functions described herein such as operating on select tissue, illuminating or irradiating same for inspection purposes or a combination thereof wherein all or selected of such variables are computer controlled. The needle may have a single passageways formed therein with the inside surfaces of the walls of the passageways being highly reflective of light, such as by polishing or forming same reflective. Each of the dual passageways may be used to respectively transmit direct (laser) light and reflections or scattering thereof from tissue adjacent the opening wherein the latter passageway guides the reflected light to a photodetector for scanning and control or monitoring purposes as described. Such a needle may be used to inspect and operate on tissue with laser radiation or the like and to guide a flow select amounts of medical material(s) to select tissue in accordance with a program or information derived from a computer, such as a spectroscopy computer automatically analyzing image signals output by the photoelectric detector(s) receiving reflected scattered or fluorescence radiation passed back through the needle.

The computer controlled application of fluid suction to the needle passageway(s) may also be employed to remove a select quantity or quantities of body fluid or tissue drawn into the needle through such opening or openings therein.

7. An elongated hollow tubular instrument, such as an open ended laparoscope tube, may be supported at the operating end of the manipulator arm assembly to be controlled in its movements and operation by signals generated by the control computer. Such instrument may employ radiation and/or a rotary cutting tool to operate on tissue adjacent the open end thereof wherein both the tool and the motors driving and positioning its support are computer controlled in their operations in accordance with a program or signals generated by one of the computer described above.

8. The automatic medical manipulators described above may also be employed to operate on and repair bone in the body of a living being by cutting and/or ablating select portions thereof with a laser and/or by disposing select quantities of fluent bone material mixed with collagen or other organic matter to replace diseased or injured bone, fill in cavities in bone, etc. The described manipulator supporting the described tube or needle may be employed to apply select fluent bone matter in vivo to replace injured, malformed or diseased bone which may be surgically removed as described, wherein the bone mixture ejected from the opening in the needle or tube solidifies or sets in place and eventually becomes part of the bone to which it is applied. Laser light passed through and out the end of the needle or tube as described above, may also be employed to operate on and ablate select bone, such as diseased or injured bone and/or to effect radiation setting or polymerizable material in the mixture or applied to select bone as described to adhere the ejected bone mixture to the bone to which it is applied.

Although the invention has been described in conjunction with the foregoing specific embodiments, many alternatives, variations, and modifications will be apparent to those of ordinary skill in the art. Those alternatives, variations, and modifications are intended to fall within the scope of the following appended claims.

What is claimed is:

1. A method for internally administering a medicinal agent to a patient, comprising the steps of:

supporting a patient on a patient support which is relatively movable with respect to an injection needle mounted on a computer controlled manipulator arm so that the injection needle may be inserted into select regions of the patient's body under control of a computer;

scanning a select portion of the patient's body with a scanning imaging device so as to generate image information relating to select regions of the patient's body;

sensing the relative positions of said patient support, said injection needle, and said scanning imaging device, and generating and feeding coded signals representing the sensed positions to a computer in digitized form;

operating the computer to calculate location coordinates of a select body region requiring treatment and defined by select pixels making of the images produced by said scanning imaging device, using the coded signals to predeterminately and relatively position of said patient support means and said imaging means;

designating and inputting to a computer select pixels of images produced by said imaging device which represent select regions of the patient's body to which it is desired to administer the medicinal agent;

calculating location coordinates of said injection needle and determining if an operating end of said injection needle is properly located at a select body region into which it is desired to administer said medicinal agent; and, when so located, forcing the operating end of said injection needle a select distance into the body and injecting said medicinal agent into said select body region.

2. A method in accordance with claim 1 further comprising the step of transmitting radiation from a radiation source through a first optical waveguide within said injection needle so as to irradiate a select body region into which said needle is inserted.

3. A method in accordance with claim 2 wherein said radiation is generated by a laser.

4. A method in accordance with claim 1 wherein said imaging device and said patient support are relatively movable with respect to one another and further comprising the step of positioning said imaging device under computer control so as to image select portions of the patient's body.

5. A method in accordance with claim 1 further comprising the steps of automatically moving said injection needle under control of said computer until said injection needle is inserted into a select body region into which it is desired to administer said medicinal agent and automatically injecting said medicinal agent.

6. A method in accordance with claim 1 further comprising the step of computer controlling the amount of medicinal agent injected into a select body region.

7. A method in accordance with claim 1 wherein said medicinal agent is a chemotherapeutic agent.

8. A method in accordance with claim 1 wherein said medicinal agent is a liposome containing a chemical agent.

9. A method in accordance with claim 1 wherein said medicinal agent is a liposome containing a biological agent.

10. A system for controllably administering a medicinal agent to a patient comprising:

a computer;

an injection needle having a conduit therein for flowing a medicinal agent into tissue in which the needle is inserted and an injector for forcing the medicinal agent through said conduit;

a patient support surface;

a manipulator arm assembly supporting said injection needle and a power driving device for moving said manipulator arm along multiple axes and for moving said patient support surface;

wherein said power driving device is under control of said computer to cause it to controllably move and insert said injection needle into select regions of the patient's body;

a scanning imaging device for generating image information of select anatomical regions of the patient's body;

sensors for sensing the relative positions of said patient support, said manipulator arm, and said scanning imaging device, and generating and feeding coded signals representing the sensed positions to said computer in digitized form;

a first program for calculating location coordinates of body regions defined by pixels making up the images produced by said scanning imaging device, using the coded signals representing the sensed relative positions of said patient support means and said imaging device;

an electronic display device for displaying images and allowing the designation and inputting to said computer of select pixels of said images which correspond to select regions of the patient's body into which it is desired to insert said injection needle and administer said medicinal agent; and a second program for calculating location coordinates of said injection needle and for determining if said injection needle is located at a select body region into which it is desired to administer said medicinal agent.

11. A system in accordance with claim 10 further comprising a radiation source controlled by said computer and coupled to a first optical waveguide within said injection needle for transmitting said radiation to a select body region.

12. A system in accordance with claim 11 wherein said radiation source is a laser.

13. A system in accordance with claim 11 wherein said device for allowing operator designation of select body portions to which therapeutic radiation is applied comprises an interactive image display system for displaying images generated by said imaging device and a cursor positionable by the operator so as to outline select areas of the displayed image, the select areas then being input to said computer to indicate the select body regions into which said medicinal agent is to be administered.

14. A system in accordance with claim 11 wherein said medicinal agent is a chemotherapeutic agent for killing cancer cells.

15. A system in accordance with claim 10 wherein said computer is programmed with software for automatically controlling movement of said manipulator arm so as to cause the insertion of said injection needle into a select body region at a desired depth.

16. A system in accordance with claim 15 wherein said computer is programmed with software for automatically controlling operation of said injector so as to cause it to inject a pretermined amount of said medicinal agent into a select body region.

17. A system in accordance with claim 10 wherein said imaging device includes an ultrasonic pulse-echo transducer means and and further comprising an actuator for effecting relative movement between said patient support surface and said imaging device including a robotic arm for positioning said ultrasonic transducer under control of said computer.

18. A system in accordance with claim 10 wherein said imaging device is a magnetic resonance imaging device.

19. A system in accordance with claim 10 wherein said imaging device is a computerized axial tomography scanner.

20. A system in accordance with claim 10 further comprising an actuator for effecting relative movement between said patient support and said imaging device under control of said computer.

* * * * *